(12) United States Patent
Lai et al.

(10) Patent No.: US 10,777,420 B1
(45) Date of Patent: Sep. 15, 2020

(54) ETCHING BACK METHOD

(71) Applicant: UNITED MICROELECTRONICS CORP., Hsin-Chu (TW)

(72) Inventors: Kuan-Ying Lai, Chiayi (TW); Chang-Mao Wang, Tainan (TW); Hsin-Yu Hsieh, Tainan (TW)

(73) Assignee: UNITED MICROELECTRONICS CORP., Hsin-Chu (TW)

(*) Notice: Subject to any disclaimer, the term of this patent is extended or adjusted under 35 U.S.C. 154(b) by 0 days.

(21) Appl. No.: 16/286,495

(22) Filed: Feb. 26, 2019

(51) Int. Cl.
*H01L 21/311* (2006.01)
*H01L 21/768* (2006.01)
*H01L 21/02* (2006.01)
*H01L 21/306* (2006.01)
*H01L 21/31* (2006.01)
*H01L 21/3065* (2006.01)
*H01L 21/3105* (2006.01)
*H01L 21/04* (2006.01)
*H01L 21/308* (2006.01)

(52) U.S. Cl.
CPC ...... *H01L 21/311* (2013.01); *H01L 21/02019* (2013.01); *H01L 21/02296* (2013.01); *H01L 21/042* (2013.01); *H01L 21/306* (2013.01); *H01L 21/308* (2013.01); *H01L 21/3065* (2013.01); *H01L 21/30655* (2013.01); *H01L 21/31* (2013.01); *H01L 21/3105* (2013.01); *H01L 21/31051* (2013.01); *H01L 21/31053* (2013.01); *H01L 21/31055* (2013.01); *H01L 21/31105* (2013.01); *H01L 21/31111* (2013.01); *H01L 21/31116* (2013.01); *H01L 21/76802* (2013.01); *H01L 21/76837* (2013.01)

(58) Field of Classification Search
CPC ......... H01L 21/02019; H01L 21/02296; H01L 21/042; H01L 21/306; H01L 21/3065; H01L 21/30655; H01L 21/308; H01L 21/31; H01L 21/3105; H01L 21/31051; H01L 21/31053; H01L 21/31055; H01L 21/31056; H01L 21/31105; H01L 21/31111; H01L 21/31116; H01L 21/311; H01L 21/76256
See application file for complete search history.

(56) References Cited

U.S. PATENT DOCUMENTS

| | | | |
|---|---|---|---|
| 7,455,955 B2 | 11/2008 | Shih | |
| 9,691,765 B1* | 6/2017 | Bi | H01L 27/0886 |
| 10,234,626 B2* | 3/2019 | Lambert | H01S 5/028 |

(Continued)

*Primary Examiner* — Eduardo A Rodela
(74) *Attorney, Agent, or Firm* — Winston Hsu (57) ABSTRACT

A material layer having recesses is formed on a substrate including a high pattern density area and a low pattern density area. A first dielectric layer and a second dielectric layer are sequentially formed to cover the material layer, wherein a top surface of the first dielectric layer in the high pattern density area is higher than a top surface of the first dielectric layer in the low pattern density area, thereby a thickness of the second dielectric layer in the low pattern density area being thicker than a thickness of the second dielectric layer in the high pattern density area. An etching back process is performed to remove the second dielectric layer and the first dielectric layer, wherein the etching rate of the etching back process to the second dielectric layer is lower than the etching rate of the etching back process to the first dielectric layer.

19 Claims, 5 Drawing Sheets

(56) References Cited

U.S. PATENT DOCUMENTS

| | | | |
|---|---|---|---|
| 2012/0142157 A1* | 6/2012 | Chen | H01L 21/31053 438/299 |
| 2013/0095644 A1* | 4/2013 | Tu | H01L 21/31053 438/585 |
| 2013/0164930 A1* | 6/2013 | Tu | H01L 21/31053 438/595 |
| 2014/0273363 A1* | 9/2014 | Chiu | H01L 21/3086 438/165 |
| 2015/0228646 A1* | 8/2015 | Ho | H01L 27/088 257/392 |
| 2015/0263132 A1* | 9/2015 | Liu | H01L 29/66545 438/303 |
| 2017/0186650 A1* | 6/2017 | Shen | H01L 21/823456 |
| 2017/0194443 A1 | 7/2017 | Chen | |
| 2017/0207126 A1* | 7/2017 | Ching | H01L 29/7848 |
| 2019/0067099 A1* | 2/2019 | Lee | H01L 29/41791 |
| 2019/0067112 A1* | 2/2019 | Liang | H01L 21/823456 |
| 2019/0165123 A1* | 5/2019 | Lo | H01L 29/6681 |

* cited by examiner

FIG. 9

ETCHING BACK METHOD

BACKGROUND OF THE INVENTION

1. Field of the Invention

The present invention relates generally to an etching back method, and more specifically to an etching back method applying dielectric layers having different etching rates.

2. Description of the Prior Art

Etching is used in Microfabrication to chemically remove layers from the surface of a wafer during manufacturing. Etching is a critically important process module, and every wafer undergoes many etching steps before it is complete. "Dry" (plasma) etching is used for circuit-defining steps, while "wet" etching (using chemical baths) is used mainly to clean wafers. Dry etching is one of the most frequently used processes in semiconductor manufacturing. Before etching begins, a wafer is coated with photoresist or a hard mask (usually oxide or nitride) and exposed to a circuit pattern during photolithography. Etching removes material only from the pattern traces. This sequence of patterning and etching is repeated multiple times during the chip making process.

Etch processes are referred to as conductor etch, dielectric etch, or polysilicon etch to indicate the types of films that are removed from the wafer. For example, dielectric etch is involved when an oxide layer is etched to leave "oxide isolators" separating devices from each other; polysilicon etch is used to create the gate in a transistor; dielectric etch is employed to etch via holes and trenches for metal conductive paths; and metal etch removes aluminum, tungsten, or copper layers to reveal the pattern of circuitry at progressively higher levels of the device structure.

SUMMARY OF THE INVENTION

The present invention provides an etching back method, which stacks dielectric layers with different etching rates to form a dielectric layer having a flat top surface in different areas with different pattern densities.

The present invention provides an etching back method including the following steps. A substrate including a high pattern density area and a low pattern density area is provided. A material layer having recesses is formed on the substrate, wherein the openings of the recesses in the low pattern density area are larger than the openings of the recesses in the high pattern density area. A first dielectric layer and a second dielectric layer are sequentially formed to cover the material layer and fill into the recesses, wherein a top surface of the first dielectric layer in the high pattern density area is higher than a top surface of the first dielectric layer in the low pattern density area, thereby a thickness of the second dielectric layer in the low pattern density area being thicker than a thickness of the second dielectric layer in the high pattern density area. An etching back process is performed to remove the second dielectric layer and a top part of the first dielectric layer, wherein the etching rate of the etching back process to the second dielectric layer is lower than the etching rate of the etching back process to the first dielectric layer.

According to the above, the present invention provides an etching back method, which forms a material layer having recesses on a substrate, wherein the openings of the recesses in a low pattern density area are larger than the openings of the recesses in a high pattern density area; sequentially forms a first dielectric layer and a second dielectric layer covering the material layer and filling into the recesses, wherein a top surface of the first dielectric layer in the high pattern density area is higher than a top surface of the first dielectric layer in the low pattern density area, thereby a thickness of the second dielectric layer in the low pattern density area being thicker than a thickness of the second dielectric layer in the high pattern density area. Thereby, as an etching back process is performed to remove the second dielectric layer and a top part of the first dielectric layer, wherein the etching rate of the etching back process to the second dielectric layer is lower than the etching rate of the etching back process to the first dielectric layer, a top surface of the first dielectric layer after the etching back process is performed can be flatter than the top surface of the first dielectric layer before the etching back process is performed.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
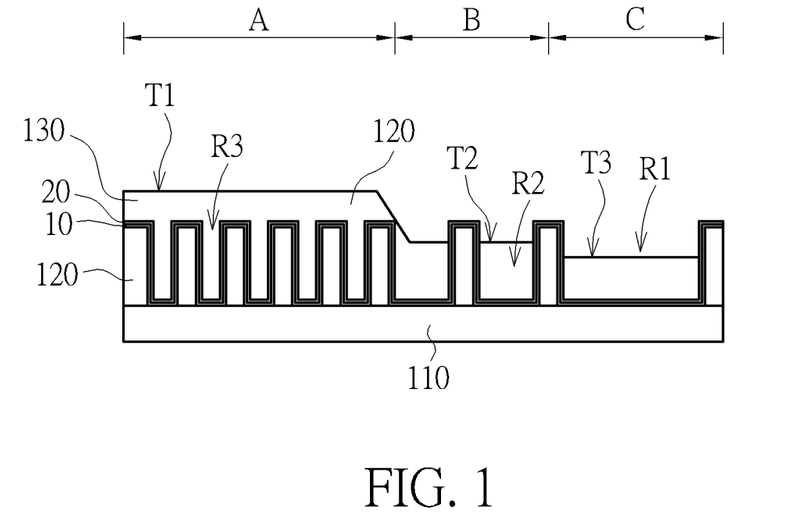
FIG. 1 schematically depicts a cross-sectional view of an etching back method according to an embodiment of the present invention.

FIGS. 1-9 schematically depict cross-sectional views of an etching back method according to an embodiment of the present invention. As shown in FIG. 1, a substrate 110 is provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The substrate 110 may include a first area A, a second area B and a third area C, but it is not limited thereto. The first area A is a high pattern density area, the second area B and the third area C are low pattern density areas, wherein the pattern density of the first area A is larger than the pattern density of the second area B, and the pattern density of the second area B is larger than the pattern density of the third area C. Isolation structures (not shown) may be disposed in the substrate 110 between the first area A, the second area B and the third area C to electrically isolate transistors in these areas from each other. The isolation structures (not shown) may be shallow trench isolation (STI) structures, which may be formed by a shallow trench isolation process, wherein the forming method is known in the art, and will not be described herein, but it is not limited thereto.

A material layer 120 is formed on the substrate 110. The material layer 120 may be an oxide layer, which may be an interlayer dielectric layer, but it is not limited thereto. The material layer 120 has recesses R1/R2/R3, wherein the openings of the recesses R1/R2 in the low pattern density area are larger than the openings of the recesses R3 in the high pattern density area. In this embodiment, the opening of the recesses R1 in the third area C is larger than the openings of the recesses R2 in the second area B, and the openings of the recesses R2 in the second area B are larger than the openings of the recesses R3 in the first area A, but it is not limited thereto. One recess R1, two recesses R1 and five recesses R3 are depicted in this embodiment, but the number of the recesses R1/R2/R3 is not restricted thereto.

A metal gate device is applied in this embodiment, so that a high-k dielectric layer 10 and a first work function metal layer 20 may be sequentially formed to conformally cover the material layer 120 and the recesses R1/R2/R3, but it is not limited thereto. The high-k dielectric layer 10 may be the group selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalite ($SrBi_2Ta_2O_9$, SBT), lead zirconate titanate ($PbZr_xTi_{1-x}O_3$, PZT) and barium strontium titanate ($Ba_xSr_{1-x}TiO_3$, BST); and, the first work function metal layer 20 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN), but it is not limited thereto. In a preferred embodiment, a barrier layer such as a tantalum nitride (TaN) layer may be formed between the high-k dielectric layer 10 and the first work function metal layer 20, to prevent materials from diffusing to the high-k dielectric layer 10, but it is not limited thereto.

Then, a first dielectric layer 130 is formed to cover the material layer 120 and fill into the recesses R1/R2/R3 in the first area A, the second area B and the third area C. In this case, the first dielectric layer 130 is a bottom anti-reflective-coating (BARC) layer, which may be formed by coating, but it is not limited thereto. Since the opening of the recesses R1 in the third area C is larger than the openings of the recesses R2 in the second area B and the openings of the recesses R2 in the second area B are larger than the openings of the recesses R3 in the third area C, a top surface T1 of the first dielectric layer 130 in the first area A is higher than a top surface T2 of the first dielectric layer 130 in the second area B, and the top surface T2 of the first dielectric layer 130 in the second area B is higher than a top surface T3 of the first dielectric layer 130 in the third area C because of a top surface of a layer in a high pattern density area being higher than a top surface of the layer in a low pattern density area.

Figure 2:
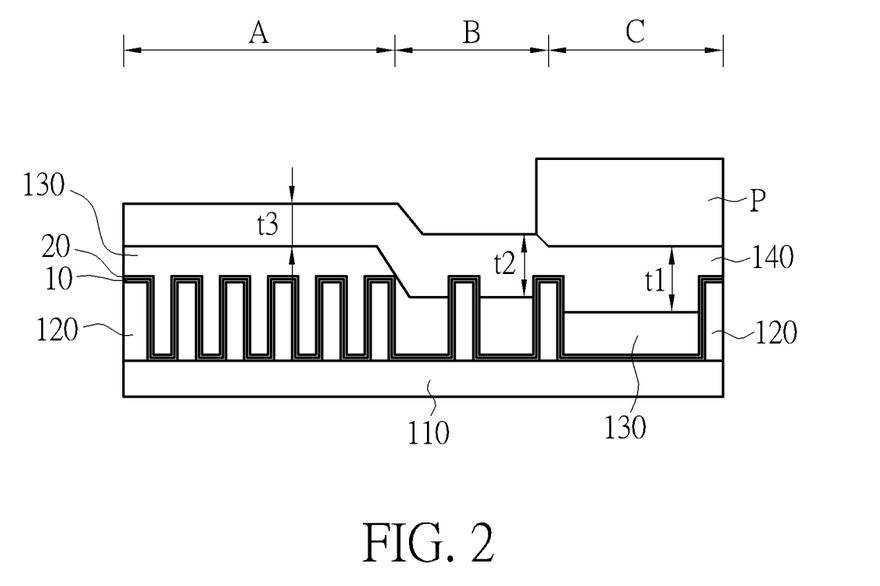
FIG. 2 schematically depicts a cross-sectional view of an etching back method according to an embodiment of the present invention.

As shown in FIG. 2, a second dielectric layer 140 is formed to fill into the recesses R1/R2/R3 and cover the first dielectric layer 130 in the first area A, the second area B and the third area C. Preferably, the second dielectric layer 140 is a bottom anti-reflective-coating (BARC) layer as well, which may be formed by coating, but it is not limited thereto. As a top surface of a layer in a high pattern density area is higher than a top surface of the layer in a low pattern density area, a thickness of an above layer in the low pattern density area is inherently thicker than a thickness of the above layer in the high pattern density area. Therefore, a thickness t1 of the second dielectric layer 140 in the third area C is thicker than a thickness t2 of the second dielectric layer 140 in the second area B, and the thickness t2 of the second dielectric layer 140 in the second area B is thicker than a thickness t3 of the second dielectric layer 140 in the first area A.

It is emphasized that, the etching rate of a later performed etching back process to the second dielectric layer 140 must be lower than the etching rate of the etching back process to the first dielectric layer 130, to eliminate the step height difference of the first dielectric layer 130 in the first area A and the second area B after the etching back process is performed. Due to the first dielectric layer 130 and the second dielectric layer 140 being bottom anti-reflective-coating (BARC) layers in this case, the first dielectric layer 130 and the second dielectric layer 140 may both contain carbon. As the carbon ratio of a bottom anti-reflective-coating (BARC) layer is larger, the etching rate of a specific etching process to this bottom anti-reflective-coating (BARC) layer can be lower. The carbon ratio of the second dielectric layer 140 is larger than the carbon ratio of the first dielectric layer 130, so that the etching rate of the later performed etching back process to the second dielectric layer 140 can be lower than the etching rate of the etching back process to the first dielectric layer 130, but it is not limited thereto. In other cases, the first dielectric layer 130 and the second dielectric layer 140 may contain different impurities, or the first dielectric layer 130 and the second dielectric layer 140 may be different layers having different etching rates. In a preferred embodiment, the carbon ratio of the first dielectric layer 130 is 50-70 wt % while the carbon ratio of the second dielectric layer 140 is 70-90 wt %, but it is not limited thereto.

Thereafter, a photoresist P is formed on the second dielectric layer 140 in the third area C. Please refer to FIGS. 3-4, an etching back process K1/K2 is performed to only remove the second dielectric layer 140 and a top part 130a of the first dielectric layer 130 in the first area A and the second area B uncovered by the photoresist P, to make a top surface T4 of a first dielectric layer 130' after the etching back process K1/K2 is performed be flatter than the top surface T1/T2/T3 of the first dielectric layer 130 (as shown in FIG. 1) before the etching back process K1/K2 is performed.

Figure 3:
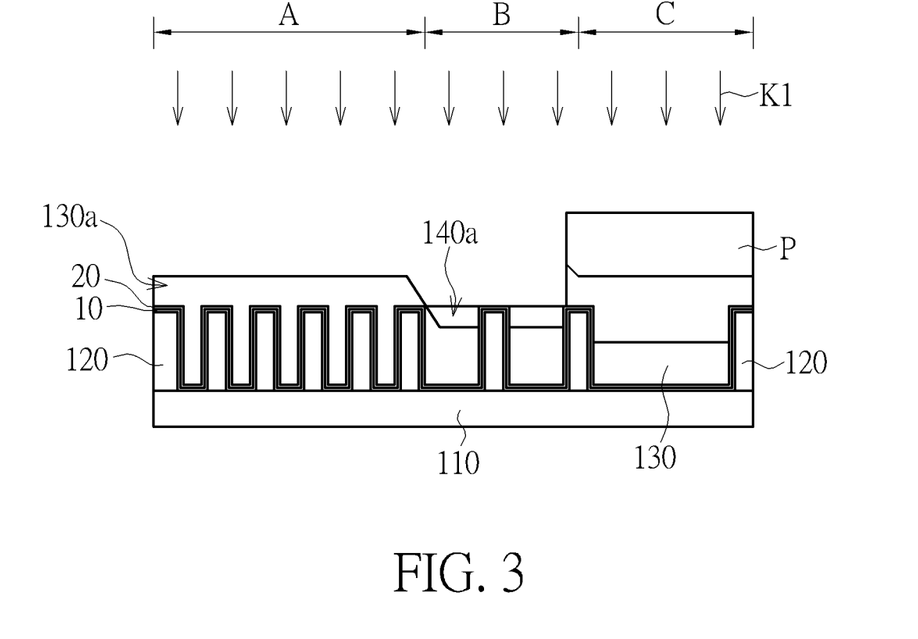
FIG. 3 schematically depicts a cross-sectional view of an etching back method according to an embodiment of the present invention.
Figure 4:
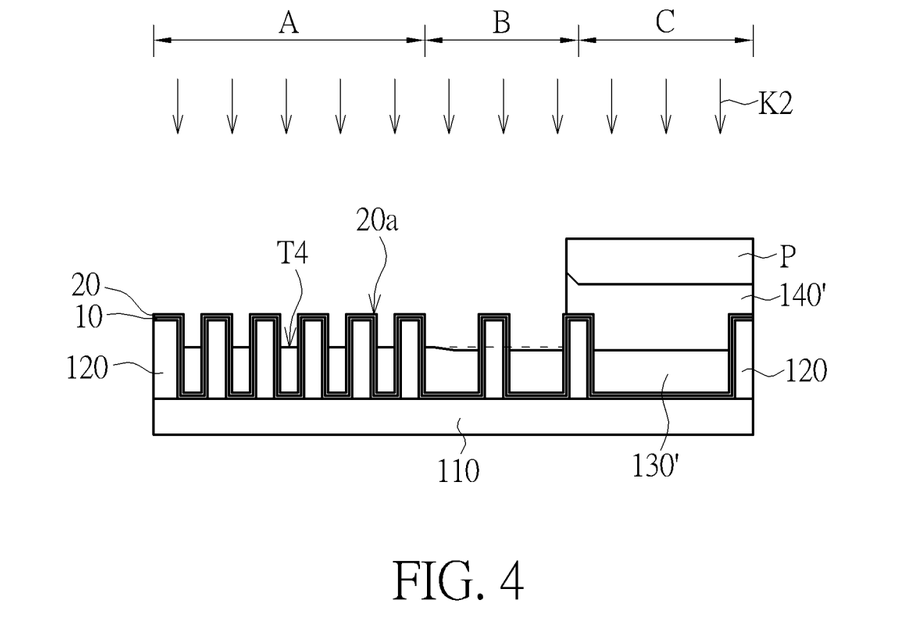
FIG. 4 schematically depicts a cross-sectional view of an etching back method according to an embodiment of the present invention.

In the present invention, the thickness t1 of the second dielectric layer 140 in the third area C is thicker than the thickness t2 of the second dielectric layer 140 in the second area B and the thickness t2 of the second dielectric layer 140 in the second area B is thicker than the thickness t3 of the second dielectric layer 140 in the first area A as shown in FIG. 2, and the etching rate of the etching back process K1/K2 to the second dielectric layer 140 is lower than the etching rate of the etching back process K1/K2 to the first dielectric layer 130 as shown in FIGS. 3-4. Therefore, the second dielectric layer 140 can be etched more slowly than the first dielectric layer 130 to make the top surface T4 of the first dielectric layer 130' as shown in FIG. 4 be flat.

More precisely, the etching back process K1/K2 may include a first etching back process K1 and a second etching back process K2. The first etching back process K1 is performed to remove the second dielectric layer 140 in the first area A completely and expose the first dielectric layer 130 in the first area A, but reserve a part 140a of the second dielectric layer 140 in the second area B, as shown in FIG. 3. Then, the second etching back process K2 is performed to remove the part 140a in the second area B completely while the top part 130a of the first dielectric layer 130 in the first area A (and optionally in the second area B) is also removed, as shown in FIG. 4. Thus, the first dielectric layer 130' having the top surface T4 in the first area A and the second area B and a second dielectric layer 140' only in the third area C are formed.

Figure 5:
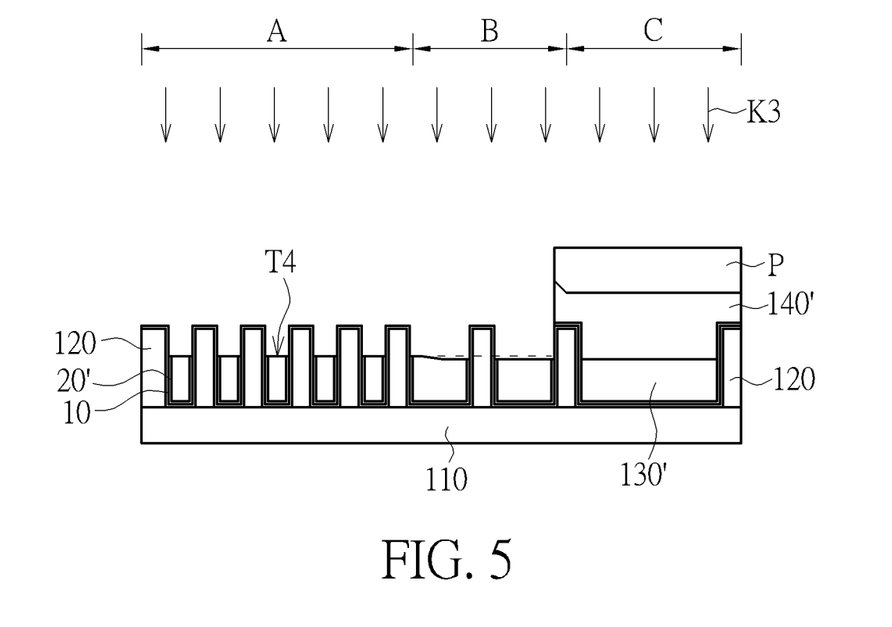
FIG. 5 schematically depicts a cross-sectional view of an etching back method according to an embodiment of the present invention.

Thereafter, an etching process K3 may be performed to remove an exposed part 20a (shown in FIG. 4) of the first work function metal layer 20 but preserve the high-k dielectric layer 10, thereby a first work function metal layer 20' is formed, as shown in FIG. 5. The etching process K3 may be a SC2 etching process, but it is not limited thereto.

Figure 6:
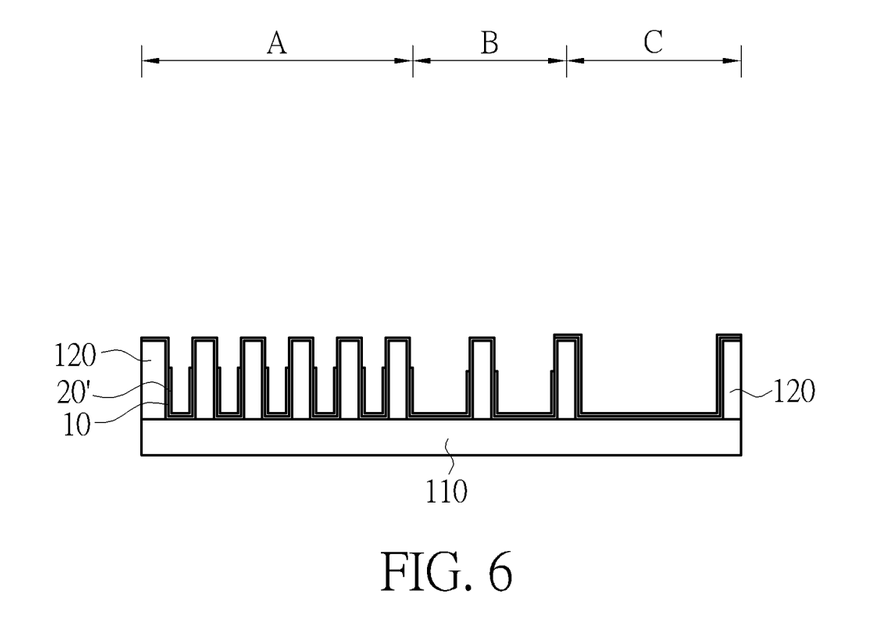
FIG. 6 schematically depicts a cross-sectional view of an etching back method according to an embodiment of the present invention.

The photoresist P is removed, and then the second dielectric layer 140' and the first dielectric layer 130' are removed completely, thus the first work function metal layer 20' being exposed, as shown in FIG. 6.

Figure 7:
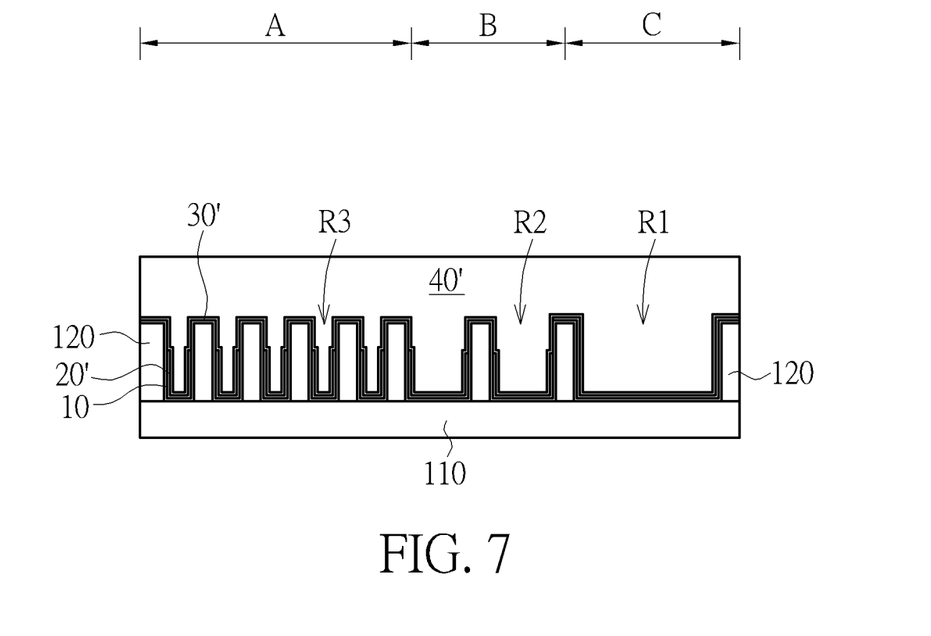
FIG. 7 schematically depicts a cross-sectional view of an etching back method according to an embodiment of the present invention.
Figure 8:
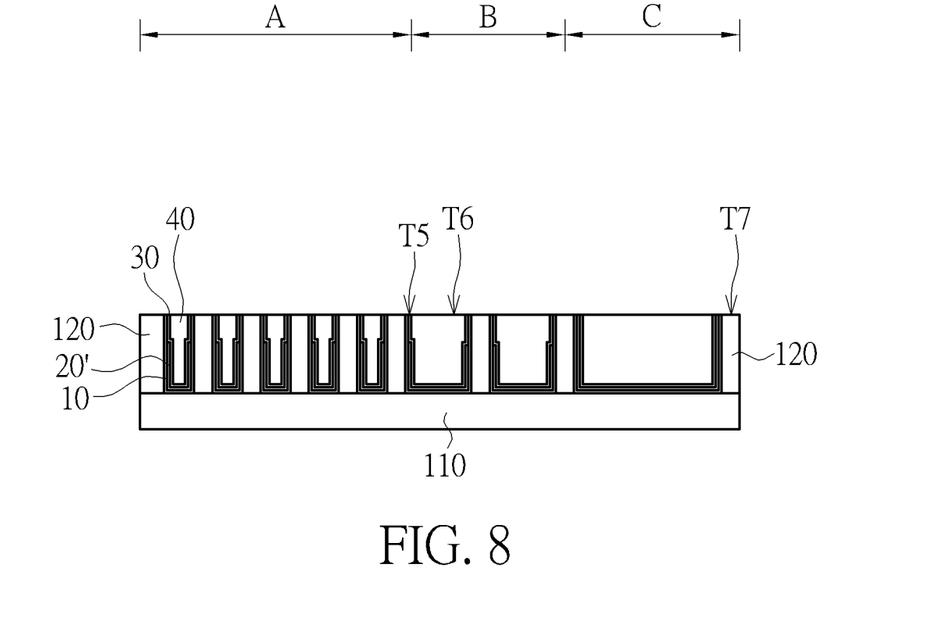
FIG. 8 schematically depicts a cross-sectional view of an etching back method according to an embodiment of the present invention.

Please refer to FIGS. 7-8, a second work function metal layer 30 and a low resistivity material 40 fill into the recesses R1/R2/R3 and blanketly cover the first work function metal layer 20, the high-k dielectric layer 10 and the substrate 110. The second work function metal layer 30 may be a single layer or a multilayer structure, composed of titanium nitride (TiN), titanium carbide (TiC), tantalum nitride (TaN), tantalum carbide (TaC), tungsten carbide (WC), titanium aluminide (TiAl) or aluminum titanium nitride (TiAlN), and the low resistivity material 40 may be composed of aluminum, tungsten, titanium aluminum (TiAl) alloy or cobalt tungsten phosphide (CoWP), but it is not limited thereto. In a preferred embodiment, the first work function metal layer 20 may be a P-type work function metal layer such as a titanium nitride (TiN) layer while the second work function metal layer 30 may be a N-type work function metal layer such as a titanium aluminide (TiAl) layer, but it is not restricted thereto.

More precisely, as shown in FIG. 7, a blanket work function metal layer 30' and a blanket low resistivity material 40' may sequentially fill into the recesses R1/R2/R3 and on the material layer 120. Then, the blanket work function metal layer 30' and the blanket low resistivity material 40' exceeding from the recesses R1/R2/R3 are removed to form the second work function metal layer 30 and the low resistivity material 40 only in the recesses R1/R2/R3, as shown in FIG. 8. A top surface T5 of the second work function metal layer 30, a top surface T6 of the low resistivity material 40 and a top surface T7 of the material layer 120 are coplanar.

Figure 9:
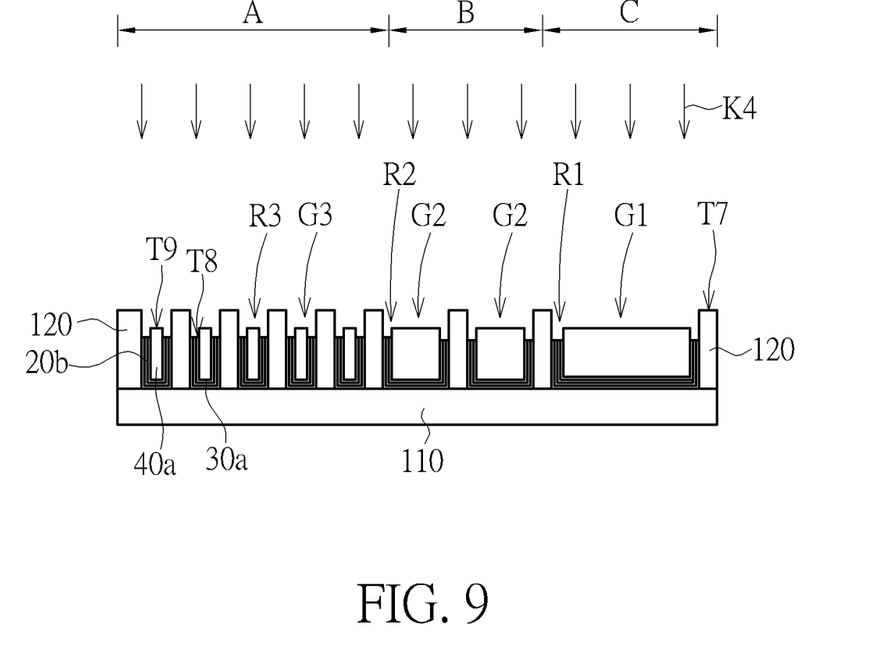
FIG. 9 schematically depicts a cross-sectional view of an etching back method according to an embodiment of the present invention.

Thereafter, an etching back process K4 is performed to etch back the low resistivity material 40, the second work function metal layer 30 and the first work function metal layer 20', thereby a first work function metal layer 20b and a second work function metal layer 30a surround a low resistivity material 40a being formed, as shown in FIG. 9. Thereby, gap filling can be improved and contact resistance can be adjusted. The whole first work function metal layer 20b, the whole second work function metal layer 30a and the whole low resistivity material 40a are in the recesses R1/R2/R3. A top surface T8 of the second work function metal layer 30a and a top surface T9 of the low resistivity material 40a are lower than the top surface T7 of the material layer 120, wherein the top surface T9 of the low resistivity material 40a is higher than the top surface T8 of the second work function metal layer 30a. Therefore, metal gates G1/G2/G3 in the recesses R1/R2/R3 are formed.

To summarize, the present invention provides an etching back method, which forms a material layer having recesses on a substrate, wherein the openings of the recesses in a low pattern density area are larger than the openings of the recesses in a high pattern density area; sequentially forms a first dielectric layer and a second dielectric layer covering the material layer and filling into the recesses, wherein a top surface of the first dielectric layer in the high pattern density area is higher than a top surface of the first dielectric layer in the low pattern density area, thereby a thickness of the second dielectric layer in the low pattern density area being thicker than a thickness of the second dielectric layer in the high pattern density area. Thereby, as an etching back process is performed to remove the second dielectric layer and a top part of the first dielectric layer, wherein the etching rate of the etching back process to the second dielectric layer is lower than the etching rate of the etching back process to the first dielectric layer, a top surface of the first dielectric layer after the etching back process is performed can be flatter than the top surface of the first dielectric layer before the etching back process is performed.

Moreover, the first dielectric layer and the second dielectric layer preferably both bottom anti-reflective-coating (BARC) layers and both contain carbon, wherein the carbon ratio of the second dielectric layer is larger than the carbon ratio of the first dielectric layer, so that the etching rate of the etching back process to the second dielectric layer can be lower than the etching rate of the etching back process to the first dielectric layer. Furthermore, the etching back process may include a first etching back process and a second etching back process. The first etching back process is preferably performed to remove the second dielectric layer in the high pattern density area completely and expose the first dielectric layer in the high pattern density area while reserve a part of the second dielectric layer in the low pattern density area, and then the second etching back process is performed to remove a part of the first dielectric layer in the high pattern density area and the whole second dielectric layer in the low pattern density area, to form the first dielectric layer having a flat top surface not only in the high pattern density area but also in the low pattern density area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An etching back method, comprising:
   providing a substrate comprising a high pattern density area and a low pattern density area;
   forming a material layer comprising an interlayer dielectric layer having recesses on the substrate, wherein the openings of the recesses in the low pattern density area are larger than the openings of the recesses in the high pattern density area;
   sequentially forming a first dielectric layer and a second dielectric layer covering the material layer and filling into the recesses, wherein a top surface of the first dielectric layer in the high pattern density area is higher than a top surface of the first dielectric layer in the low pattern density area, thereby a thickness of the second dielectric layer in the low pattern density area being thicker than a thickness of the second dielectric layer in the high pattern density area; and performing an etching back process to remove the second dielectric layer and a top part of the first dielectric layer, wherein the etching rate of the etching back process to the second dielectric layer is lower than the etching rate of the etching back process to the first dielectric layer.

2. The etching back method according to claim 1, wherein a top surface of the first dielectric layer after the etching back process is performed is flatter than the top surface of the first dielectric layer before the etching back process is performed.

3. The etching back method according to claim 1, wherein performing the etching back process comprises performing a first etching back process and then performing a second etching back process.

4. The etching back method according to claim 3, wherein a part of the second dielectric layer in the low pattern density area is reserved while the second dielectric layer in the high pattern density area is removed completely after the first etching back process is performed.

5. The etching back method according to claim 1, wherein the second dielectric layer is removed completely after the etching back process is performed.

6. The etching back method according to claim 1, wherein the first dielectric layer and the second dielectric layer are formed by coating.

7. The etching back method according to claim 6, wherein the first dielectric layer and the second dielectric layer comprise bottom anti-reflective-coating (BARC) layers.

8. The etching back method according to claim 1, wherein the first dielectric layer and the second dielectric layer both contain carbon, wherein the carbon ratio of the second dielectric layer is larger than the carbon ratio of the first dielectric layer.

9. The etching back method according to claim 8, wherein the carbon ratio of the first dielectric layer is 50-70 wt % while the carbon ratio of the second dielectric layer is 70-90 wt %.

10. The etching back method according to claim 1, further comprising:
filling metal gates in the recesses.

11. The etching back method according to claim 10, further comprising:
forming a high-k dielectric layer and a first work function metal layer to conformally cover the material layer and the recesses before the first dielectric layer is formed.

12. The etching back method according to claim 11, further comprising:
removing an exposed part of the first work function metal layer but preserving the high-k dielectric layer after the etching back process is performed.

13. The etching back method according to claim 12, the exposed part of the first work function metal layer is removed by a SC2 etching process.

14. The etching back method according to claim 13, further comprising:
removing the first dielectric layer completely after the etching back process is performed.

15. The etching back method according to claim 14, further comprising:
filling a second work function metal layer and a low resistivity material into the recesses.

16. The etching back method according to claim 15, wherein the steps of filling the second work function metal layer and the low resistivity material into the recesses comprise:
sequentially filling a blanket work function metal layer and a blanket low resistivity material into the recesses and on the material layer; and
removing the blanket work function metal layer and the blanket low resistivity material exceeding from the recesses.

17. The etching back method according to claim 16, further comprising:
etching back the second work function metal layer and the low resistivity material after the blanket work function metal layer and the blanket low resistivity material exceeding from the recesses are removed.

18. An etching back method, comprising:
providing a substrate comprising a high pattern density area and a low pattern density area;
forming a material layer having recesses on the substrate, wherein the openings of the recesses in the low pattern density area are larger than the openings of the recesses in the high pattern density area;
sequentially forming a first dielectric layer and a second dielectric layer covering the material layer and filling into the recesses, wherein a top surface of the first dielectric layer in the high pattern density area is higher than a top surface of the first dielectric layer in the low pattern density area, thereby a thickness of the second dielectric layer in the low pattern density area being thicker than a thickness of the second dielectric layer in the high pattern density area; and
performing an etching back process to remove the second dielectric layer and a top part of the first dielectric layer, wherein the etching rate of the etching back process to the second dielectric layer is lower than the etching rate of the etching back process to the first dielectric layer, wherein a top surface of the first dielectric layer after the etching back process is performed is flatter than the top surface of the first dielectric layer before the etching back process is performed.

19. An etching back method, comprising:
providing a substrate comprising a high pattern density area and a low pattern density area;
forming a material layer having recesses on the substrate, wherein the openings of the recesses in the low pattern density area are larger than the openings of the recesses in the high pattern density area;
sequentially forming a first dielectric layer and a second dielectric layer covering the material layer and filling into the recesses, wherein a top surface of the first dielectric layer in the high pattern density area is higher than a top surface of the first dielectric layer in the low pattern density area, thereby a thickness of the second dielectric layer in the low pattern density area being thicker than a thickness of the second dielectric layer in the high pattern density area; and
performing an etching back process to remove the second dielectric layer and a top part of the first dielectric layer, wherein the etching rate of the etching back process to the second dielectric layer is lower than the etching rate of the etching back process to the first dielectric layer, wherein the second dielectric layer is removed completely after the etching back process is performed.

* * * * *